United States Patent [19]
Teramoto et al.

[11] 4,432,092
[45] Feb. 14, 1984

[54] SEMICONDUCTOR LASER

[75] Inventors: Iwao Teramoto, Ibaraki; Takashi Sugino, Takatsuki; Kunio Itoh, Uji, all of Japan

[73] Assignee: Matsushita Electric Industrial Co., Ltd., Kadoma, Japan

[21] Appl. No.: 270,351

[22] Filed: Jun. 4, 1981

[30] Foreign Application Priority Data

Jun. 17, 1980 [JP] Japan .................................. 55-82642

[51] Int. Cl.$^3$ .............................................. H01S 3/19
[52] U.S. Cl. ........................................ 372/46; 357/17
[58] Field of Search ....................... 372/44, 45; 357/17

[56] References Cited

U.S. PATENT DOCUMENTS 3,916,339 10/1975 Ladany et al. ......................... 372/46
4,122,410 10/1978 Kressel et al. ......................... 372/46

*Primary Examiner*—James W. Davie
*Attorney, Agent, or Firm*—Cushman, Darby & Cushman

[57] ABSTRACT

A very narrow current injection region (16″) is made by means of terrace-shaping of the surface of the current limiting layer (13) forming a step thereon, the current limiting layer being on the epitaxially grown double hetero structure layers (10, 11 and 12) including the active layer (11). By so terrace-shaping, when Zn as a p-type impurity to form the current injection region (16) is diffused from the surface of the current limiting layer (13), the diffused region is formed to have a deeper part (16″) and a shallower part (16′), and the deeper part (16″) can be made very narrow by selecting the position of the stripe-shaped diffused region with respect to the step (14).

4 Claims, 7 Drawing Figures

F I G. 2
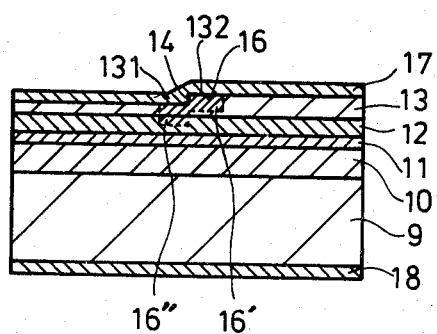

SEMICONDUCTOR LASER

BACKGROUND OF THE INVENTION

1. Field of the Invention

The present invention relates to an improvement in a semiconductor laser of planar type.

2. Description of the Prior Art

Semiconductor laser has advantages of smallness of bulk, high efficiency and direct modulation by means of its current, and therefore has a bright future as light sources for optical communication, optical data processing. Laser for such use necessitates characteristics of stable fundamental transverse mode lasing, low threshold current, high output of light and high reliability.

The conventional laser which has a structure of simple gain guiding has a difficulty in maintaining a transverse mode for a wide range of current, and therefore is liable to occurrence of undesirable mode conversion or a generation of higher modes. As a result of these, the light-current characteristic is likely to have a kink of characteristic curve or the device is likely to have a multiple longitudinal mode oscillation.

FIG. 1 shows a conventional semiconductor stripe laser of the planar type. The laser of FIG. 1 has a double-hetero structure which has on

| | |
|---|---|
| a substrate 1 of | n-GaAs |
| a first clad layer 2 of | n-GaAlAs, |
| an active layer 3 of | non-doped GaAlAs, |
| a second clad layer 4 of | p-GaAlAs and |
| an isolation layer 5 of | n-GaAlAs, which forms a p-n isolation junction between it and the underlying p-type second clad layer 4 and has a |
| stripe-shaped current injection region 6 of | p-type diffused region formed by diffusing an acceptor such as Zn, in a manner to penetrate it and diffuse into the midway of the second clad layer. |

Numeral 7 and 8 designate p-side and n-side electrode ohmicly contacting the current injection region 6 and the substrate 1, respectively.

In such planar stripe laser, by nearing the diffusion front of the current injection region 6 to the active layer 3, the spread of current path is suppressed to some extent. However, minimizing of the width of the current path 6, which is mainly determined by the width of the diffused region 6, is limited. And furthermore, when a very narrow diffused region is used, an internal series resistance of the laser becomes large. On the other hand, decreasing of threshold current requires limiting of injected current in a very narrowly limited region, and the narrowness of width of the spreading current in the active layer mainly determines stability of the transverse mode oscillation. Therefore, the width of the spread of the injected current in the active layer, or effective width of the current path in the active layer should be narrowed as much as possible in order to obtain good semiconductor laser.

SUMMARY OF THE INVENTION

The present invention purposes to provide an improved laser capable of stable fundamental mode lasing at a low threshold current by narrowing effective path of current injection to active layer.

BRIEF EXPLANATION OF DRAWINGS

FIG. 2 is a sectional elevation view of an example of a semiconductor laser embodying the present invention.

DESCRIPTION OF PREFERRED EMBODIMENTS

Figure 1:
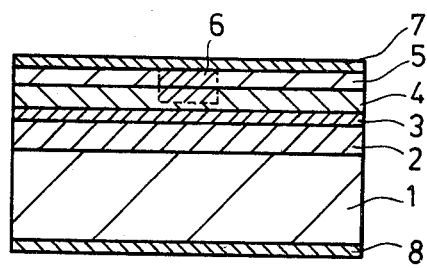
FIG. 1 is a sectional elevation view of the example of conventional planar type semiconductor laser.

The present invention is an improvement of planar lasers wherein current injection region 16 having very narrow bottom part 16″ can be formed at a close vicinity to the active layer 11, thereby effectively limit the width of current injection path.

The semiconductor laser in accordance with the present invention comprises:

a semiconductor substrate having thereon semiconductor epitaxial layers including an active layer, a current limiting layer overriding the uppermost layer of the above-mentioned semiconductor epitaxial layers, and having an opposite conductivity to that of the uppermost layer, a stripe-shaped impurity diffused region having an impurity of opposite conductivity type to that of the current limiting layer, characterized in that the current limiting layer is terrace-shaped having a thinner part and a thicker part with a step inbetween, and the stripe-shape impurity diffused region is disposed substantially over the step, thereby making the diffused region have a deeper part of a narrower width than that of the stripe-shaped impurity diffused region and a shallower part, a diffusion front of the deeper part remaining in a layer neighboring on the active layer.

The improved laser shown in the embodiment of FIG. 2 has a terraced current limiting layer 13, from the surface of which the current injection region 16 is diffused, thereby to form a step-shaped narrowed diffusion front 16″. The structure of the embodiment of FIG. 2 has

| | |
|---|---|
| a substrate 9 of | n-GaAs, |
| and thereon epitaxial layers of | |
| a first clad layer 10 of | n-Ga$_{1-x}$Al$_x$As, |
| an active layer 11 of | (non-doped)Ga$_{1-y}$Al$_y$As |
| a second clad layer 12 of | p-Ga$_{1-z}$Al$_z$As, |
| a current limiting layer 13 having | |
| a terraced top face of | n-GaAs, and |
| a current injection region 16 of | Zn-diffused region, | where $0 \leq y < x$, $z \leq 1$. Thereon, a p-side electrode 17 and an n-side electrode 18 are formed on the p-side face and n-side face of the above-mentioned wafer.

the impurity diffused region 16 is formed to have step-shaped bottom thereby having a narrow width bottom part 16″ at the vicinity of the active layer 11. That is, the shallower part 16′ of the diffusion front of the diffused region 16 remains in the current limiting layer 13, and the deeper part 16″ reaches the second clad layer 12. This is because the current limiting layer 13 has the terrace structure, and hence the diffusion front of the Zn-diffused region 16 becomes to have two positions.

As a result of the above-mentioned configuration as shown in FIG. 2, the current injection region 16 has a wide area to contact the p-side metal electrode 17 thereby attaining an efficient current injection and at the same time has a narrowly limited width at the diffusion front of its deeper part 16″ thereby effectively confining the lasing region in the active layer 11. Therefore, a strong oscillation by a large injected current in a nallow width lasing region is obtainable thereby enabling strong and stable fundamental transverse mode oscillation.

Hereinafter, manufacturing of the laser of FIG. 2 is elucidated in detail referring to FIG. 3(a) to FIG. 3(d).

Figure 3A:
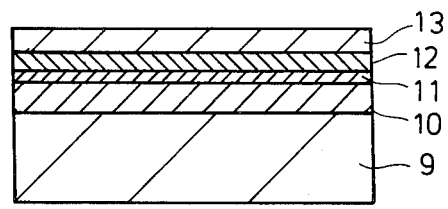
FIGS. 3(a), 3(b), 3(c) and 3(d) are sectional elevation views showing various steps of an example of manufacturing process of the laser shown in FIG. 2.

On a principal face of (100) surface of an n-GaAs substrate 21, the following layers are sequentially formed by means of known sequential liquid phase epitaxial growth method as shown by FIG. 3(a).

| | |
|---|---|
| a first clad layer 10 of | n-$Ga_{0.65}Al_{0.65}As$ of about $5 \times 10^{18} Cm^{-3}$ concentration and about 3 μm thick, |
| an active layer 11 of | n-$Ga_{0.95}Al_{0.05}As$ of about $1 \times 10^{17} Cm^{-3}$ concentration and about 0.1 μm thick, |
| a second clad layer 12 of | p-$Ga_{0.65}Al_{0.35}As$ of about $1 \times 10^{17} Cm^{-3}$ concentration and about 1 μm thick, and |
| a current limiting layer 13 of | n-GaAs of about $5 \times 10^{17} Cm^{-3}$ concentration and about 1.5 μm thick. |

Figure 3B:
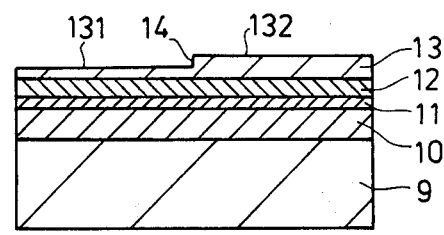
Figure 3C:
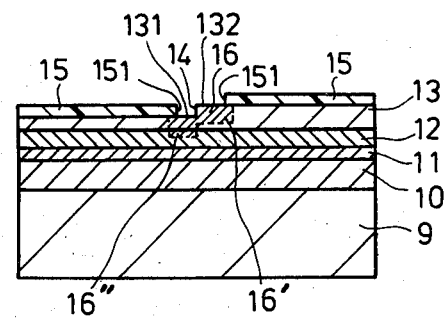
Figure 3D:
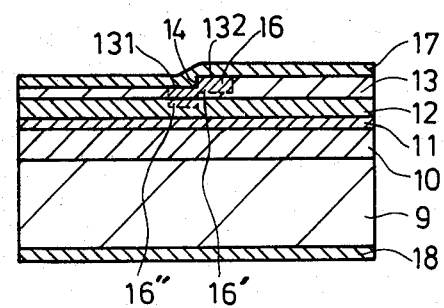

Then a terrace shape step 14 of about 1 μm height is formed, retaining a thinner part 131 of the current limiting layer 13 as shown in FIG. 3(b), by a known chemical etching utilizing a known photo-resist mask. Then, an $Si_3N_4$ film 15 as a diffusion mask is formed to cover the wafer, and a stripe-shaped opening 151 of about 5 μm width is formed by known photo-lithographic method at the part over the step 14 of the substrate 1. In this forming of the stripe-shaped opening 15, the position of the opening 15 is so selected that thinner part 131 is exposed in the opening 151 by a width of 2 μm and the thicker part 132 is exposed in the opening 15 by a width of 3 μm. Thereafter, a known Zn-diffusion as a p-type impurity is carried out through the opening 151, in a manner that the diffused front of deeper part, which corresponds to a part of the thinner part 131 lying under the opening 151, reaches and remains in the second clad layer 12, and the diffused front of shallower part, which corresponds to a part of the thinner part 132 lying under the opening 151 remains in the current limiting layer 13, as shown in FIG. 3(c). Diffusion temperature is about 750° C. Then, the $Si_3N_4$ mask 15 is removed by known method. A p-side electrode film 17 is formed by known vapor deposition method and an n-side electrode film 18 is formed by known vapor deposition method followed by alloying with the substrate 9 as shown by FIG. 3(d). The finished semiconductor laser wafer is then cleaved into individual unit chip and mounted onto a known copper mount (not shown).

The width of the deeper part 16″ of the diffused region 16 is defined as an overlapping part of both the thinner part 131 of the current limiting layer 13 and the diffused region 16. Therefore, the width can be made narrower than that of the diffused region 16. That is, in order to obtain a very narrow width of the deeper part 16″, it suffices that the stripe-shaped opening 151 of the diffusion mask 15 is carefully disposed with respect to the step 14, in a manner that the gap between the edge of the opening 151 which is on the thinner part 131 and the step 14 becomes as narrow as possible. By this method, a very narrow width of the diffusion front of 2 μm or narrower can be obtained with a high repeatability.

Figure 4:
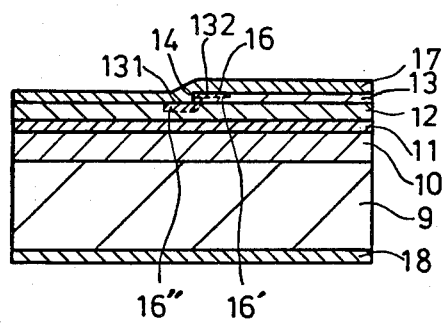
FIG. 4 is a sectional elevation view of a modified example embodying the present invention.

FIG. 4 is a sectional elevation view of a modified example embodying the present invention. The corresponding parts to the example of FIG. 3(d) is designated by the same numerals and the explanation is omitted for simplicity. In this example, the thinner part 131 of the current limiting layer 13 is of the thickness of zero. That is, the current limiting layer 13 is provided only on the half side of the wafer. The thinner part 131 is totally removed by the chemical etching.

In the above-mentioned semiconductor laser, the current flows from the p-side electrode 17, through the impurity-diffused region 16, and injected from the deeper part 16″ of the diffused region 16 of very narrow width to a limited region in a closely disposed active layer 11, and therefore, widthwise spreading of the injected current in the active layer is drastically limited in comparison with the prior art device of FIG. 1. Therefore, even in an operation of injecting a large current into the active layer, the lasing region is limited to a designed narrow region, different from the conventional device where the lasing region becomes spreaded as the injected current increases. Thereby, the present semiconductor laser can oscillate with a stable fundamental transverse mode even at a large power oscillation. Furthermore, the threshold current is minimized to about one third (to about 30 mA) of the conventional planar type stripe laser (of the stripe width 7 μm and threshold current of 90 mA).

As a result of such narrow current injection region and wider surface part thereof, a large current can be taken in from the p-side electrode and the current injection to the active layer can be made to a very limited narrow region of the latter, attaining a stable fundamental mode transverse mode oscillation and low threshold current.

What is claimed is:

1. In a semiconductor laser the combination comprising:
   a semiconductor substrate having thereon semiconductor epitaxial layers including an active layer,
   a current limiting layer overriding the uppermost layer of said semiconductor epitaxial layers and having an opposite conductivity to that of said uppermost layer,
   a stripe-shaped impurity diffused region having an impurity of opposite type to that of said current limiting layer,
   wherein
   said current limiting layer is terrace-shaped having a thinner part and a thicker part with a step inbetween, and
   said stripe-shaped impurity diffused region is disposed substantially over said step, thereby making said diffused region have a deeper part of a narrower width than that of said stripe-shaped impurity diffused region and a shallower part, a diffusion front of said deeper part remaining in a layer neighboring on said active layer.

2. A semiconductor laser in accordance with claim 1, wherein a diffusion front of said shallower part remains in said current limiting layer.

3. A semiconductor laser in accordance with claim 1, wherein width of said deeper part is substantially defined as the width of such part of said stripe-shaped impurity diffused region that lies in the thinner part of said current limiting layer.

4. In a semiconductor laser the combination comprising:
- a semiconductor substrate having thereon semiconductor epitaxial layers including an active layer,
- a current limiting layer overriding the uppermost layer of said semiconductor epitaxial layers and having an opposite conductivity to that of said uppermost layer,
- a stripe-shaped impurity diffused region having an impurity of opposite type to that of said current limiting layer,
- wherein said current limiting layer is terrace-shaped with a step, and
- said stripe-shaped impurity diffused region is disposed substantially over said step, thereby making said diffused region have a deeper part of a narrower width than that of said stripe-shaped impurity diffused region and a shallower part, a diffusion front of said deeper part remaining in a layer neighboring on said active layer.

* * * * *